(12) United States Patent
Nelson (10) Patent No.: US 6,583,921 B2
(45) Date of Patent: Jun. 24, 2003

(54) MICROMECHANICAL DEVICE AND METHOD FOR NON-CONTACTING EDGE-COUPLED OPERATION

(75) Inventor: William E. Nelson, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/745,330

(22) Filed: Dec. 21, 2000

(65) Prior Publication Data

US 2001/0053016 A1 Dec. 20, 2001

Related U.S. Application Data (60) Provisional application No. 60/173,285, filed on Dec. 28, 1999.

(51) Int. Cl.[7] .............................................. G02B 26/00
(52) U.S. Cl. ........................ 359/291; 359/292; 359/295; 359/234; 359/223
(58) Field of Search ................................. 359/290, 291, 359/295, 245, 292, 223, 224, 293, 234; 353/31, 33, 34, 81, 82, 97, 98, 99

(56) References Cited

U.S. PATENT DOCUMENTS 5,726,718 A * 3/1998 Doherty et al. ............. 348/771
6,147,790 A * 11/2000 Meier et al. ................. 359/291
6,250,763 B1 * 6/2001 Fielding et al. ............... 353/31

* cited by examiner

Primary Examiner—Hung Xuan Dang
Assistant Examiner—Tuyen Tra
(74) Attorney, Agent, or Firm—Charles A. Brill; Wade James Brady III; Frederick J. Telecky, Jr.

(57) ABSTRACT

A new non-contacting, edge-coupled micromechanical device and method, requiring no contact between the mirror or underlying yoke and landing pads on the substrate. Elimination of physical contact eliminates the problem of "sticking" mirrors found in conventional devices, and simplifies the manufacturing process by reducing the requirements for passivation coatings and hermetic packages. A capture electrode 24 is provided at an appropriate elevation above the surface of the device so as to be in close proximity with the edge of the mirror 20 or yoke 22 when it rotates to the desired angle. The capture electrode 24 and mirror assembly are biased to establish a very high electrostatic attraction between the two which stops the mirror. The mirror can be critically damped to prevent oscillations of the mirrors by tailoring at least one of the voltages applied to the mirror and capture electrode.

27 Claims, 9 Drawing Sheets

INTENSE FIELD CONCENTRATION

MICROMECHANICAL DEVICE AND METHOD FOR NON-CONTACTING EDGE-COUPLED OPERATION

This application claims priority under 35 USC §119(e)(1) of provisional application No. 60/173,285 filed Dec. 28, 1999.

BACKGROUND OF THE INVENTION

1. Field of the Invention

The present invention relates to spatial light modulators and more specifically to a Digital Micromirror Device (DMD) spatial light modulator utilizing a new noncontacting, edge-coupled hidden hinge geometry.

2. Description of the Related Art

Figure 1A:
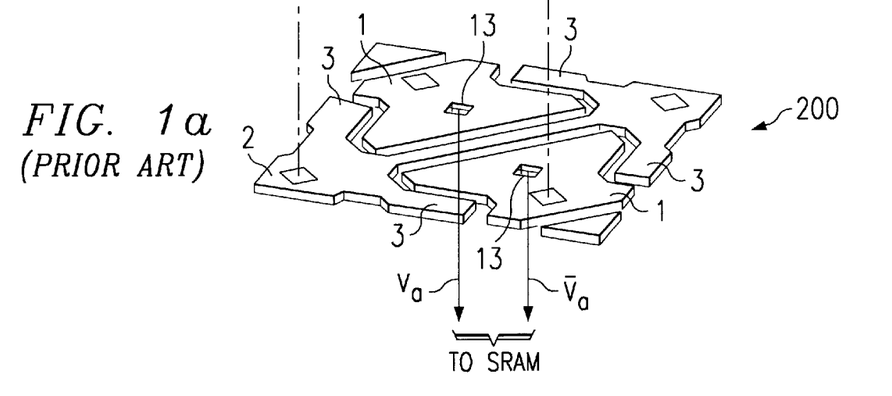
FIG. 1 shows the construction layers for a conventional hidden hinge Digital Micromirror Device (DMD). (prior art)
Figure 1B:
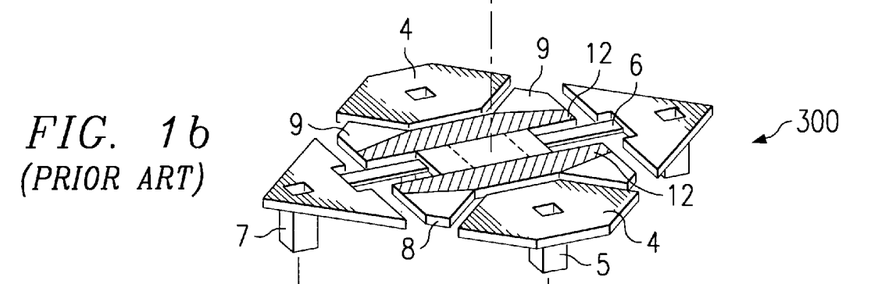
Figure 1C:
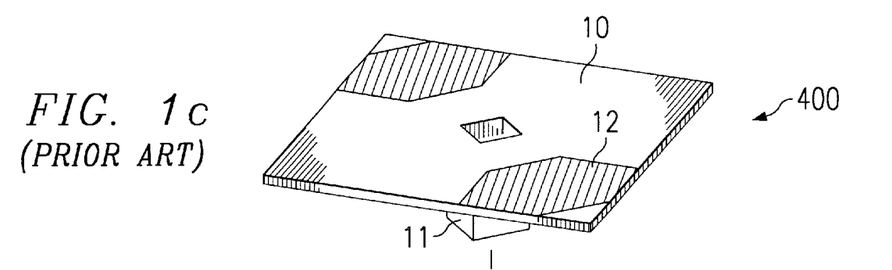

FIG. 1 shows a conventional hidden hinge Digital Micromirror Device (DMD) broken into it's three metal layers of construction, all of which is built on top of a rather standard SRAM memory cell. FIG. 1a shows the first metal layer 200 above the memory cell which consists of yoke address pads 1, a bias/reset bus 2, landing sites 3, and via connections 13 to the SRAM memory cell below (not shown). FIG. 1b shows the second layer 300 of metal structures consisting of the mirror address electrodes 4, electrode support posts 5, torsion hinge 6, hinge support posts 7, yoke 8, and the yoke landing tips 9. This second metal layer 300 assembly sits on top of the first metal layer 200, being supported by means of the electrode support posts 5 and hinge support post 7. Finally, FIG. 1c shows the third layer of metal 400 that consists of the highly reflective mirror 10 and it's support post 11. As before, the mirror assembly 400 sits on top of the second metal layer 300, being supported by the mirror support post 11 sitting in the middle of the yoke 8. In operation, a bias voltage is applied to the bias/reset bus 2 that is integral to the yoke assembly 8 by means of the hinge support posts 7. The yoke address pads 1 and mirror address electrodes 4 are then pulsed to establish an electric field between the address pads and the mirror assembly that generates an electrostatic force causing the yoke/mirror assembly to tilt in one direction or the other depending on the binary state of the underlying memory cell. As illustrated, although the yoke and mirror assemblies rotate together, electrostatic forces are established in two areas 12 (shown as cross hatched areas); i.e., between the yoke address pad 1 on the first level and the yoke 8 on the second level, as well as between the mirror address electrodes 4 on the second level and the mirror 10 on the third level. The yoke 8 rotates until its two landing tips 9 contacts the landing sites 3 on the lower metal layer 200. The angle of rotation is a function of the yoke geometry and the height of the second metal 300 layer above the lower metal layer 200. The long, thin, narrow torsion hinges 6, which supports the yoke 8 and mirror 10 from the hinge support posts 7, have a torque applied to them allowing the thicker yoke 8 to remain flat. Finally, a reset pulse can be applied to the bias/reset bus 2 to lift off and free the mirror/yoke assembly from the landing sites 3.

Figure 2:
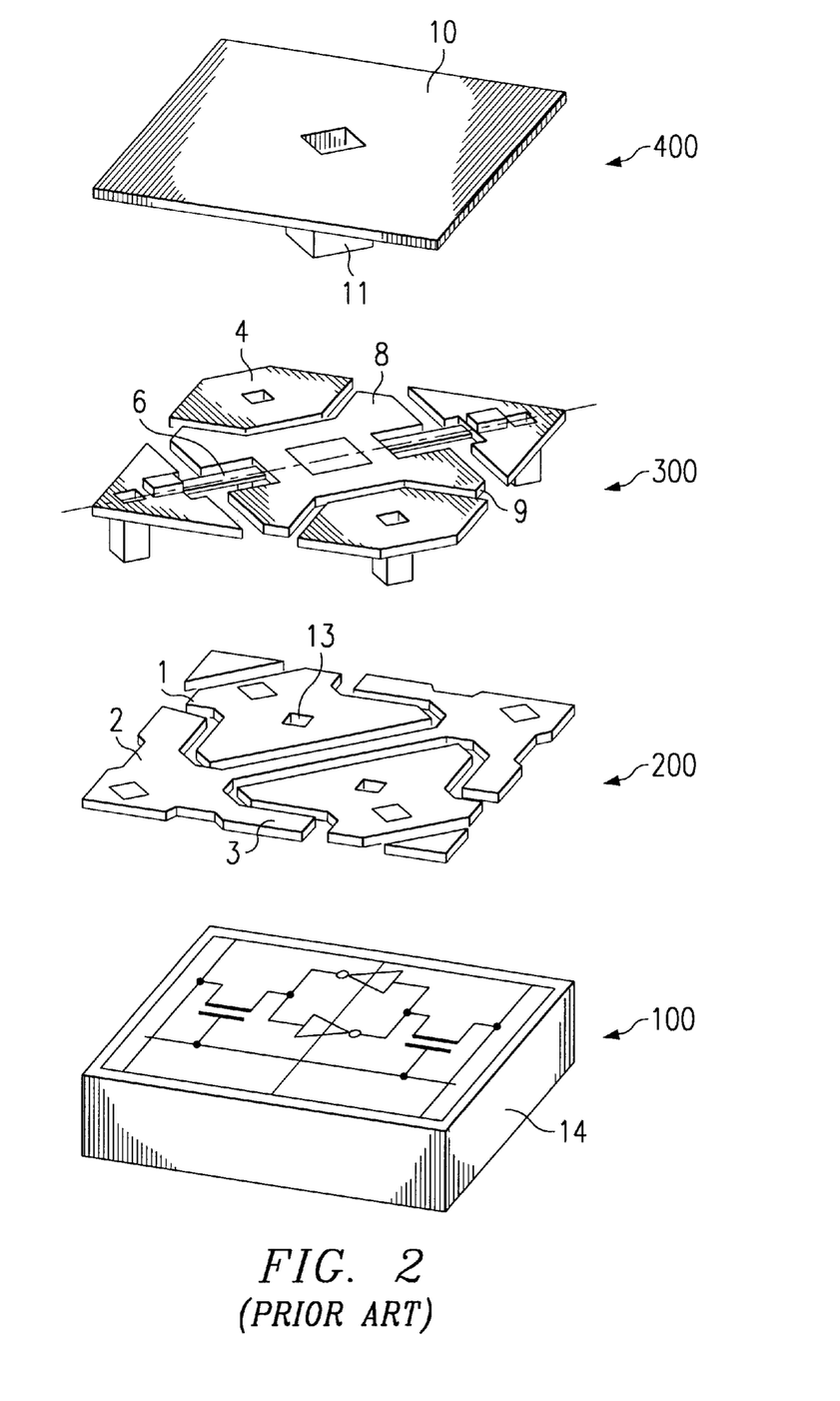
FIG. 2 illustrates the build-up of the construction layers of a conventional hidden hinge Digital Micromirror Device (DMD) on top of a SRAM memory layer. (prior art)

FIG. 2 shows a three-dimensional build-up of a conventional DMD's four layers, including the SRAM memory, which was mentioned above. These consist of the CMOS SRAM memory layer 100, the address and landing pad layer 200, the yoke and hinge layer 300, and the mirror layer 400. It can be seen from the figure that this conventional DMD device is symmetrical about a diagonal axis running parallel with the hinge, so that in operation the mirror assembly will tilt in the positive or negative direction depending on the binary state ("0" or "1") of the SRAM memory cell 14. The geometry of a typical DMD is such that the mirror will tilt on the order of ±100.

Figure 3:
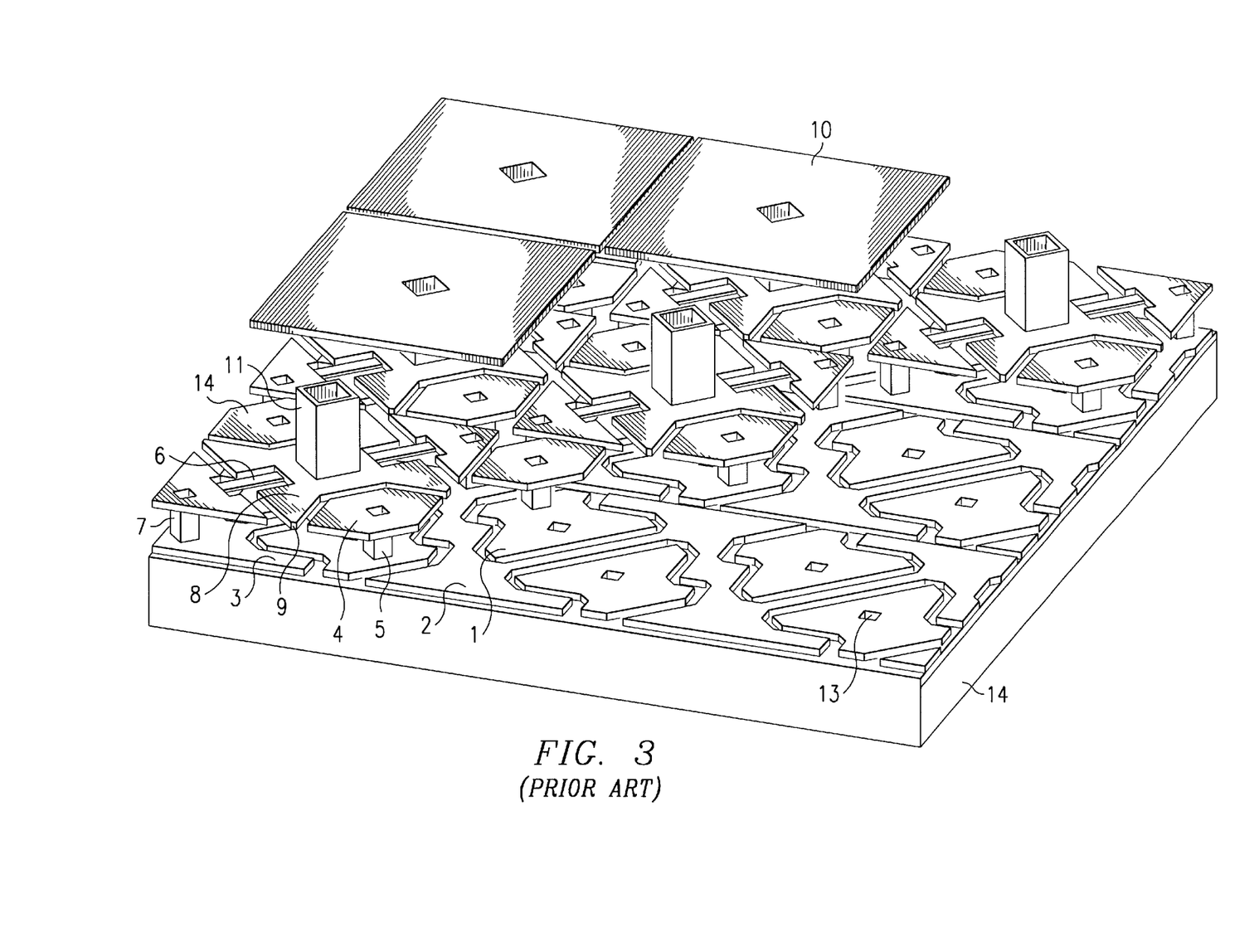
FIG. 3 is a 3-D cutaway view of an array of conventional hidden hinge DMD pixels showing three of the mirrors and the underlying structure. (prior art)

FIG. 3 is a 3-D cutaway view of an array of conventional hidden hinge DMD pixels showing three of the mirrors and the underlying structure for other pixels. Included in the view are the following: yoke address pad 1, bias/reset bus 2, yoke landing sites 3, mirror address electrode 4, electrode support post 5, torsion hinge 6, hinge support posts 7, yoke 8, yoke landing tips 9, reflective mirror 10, mirror support post 11, vias 13 to SRAM memory cell 14. The square mirrors tilt on the order of ±10° and are highly reflective to visual light in the color spectrum from 400 to 650 nanometers. The gaps between the mirrors are typically <1 micron in width.

Figure 4:
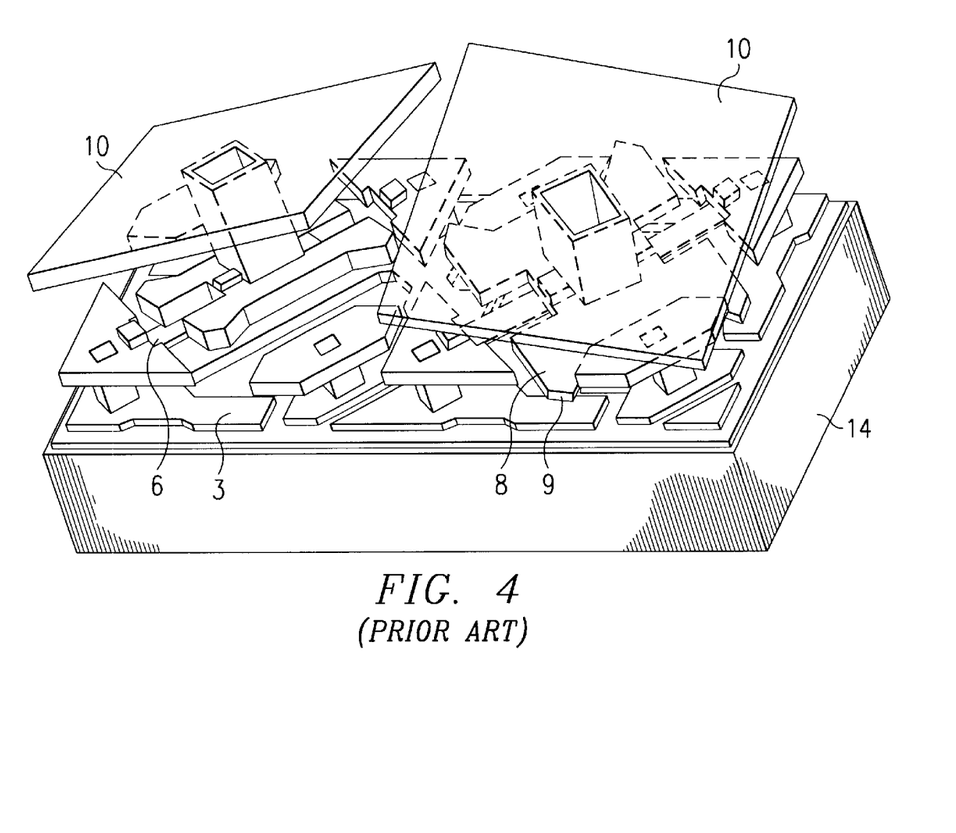
FIG. 4 illustrates the operation of two tilted DMD mirrors (+ and −10°) with landed yoke tips. (prior art)

FIG. 4 illustrates two DMD cells, with their mirrors 10 shown transparent so as to expose a view of the underlying structure. One mirror is shown rotated −10° and the other is shown rotated +10°, representing a "0" and "1" binary state, respectively in the underlying memory cells 14. This figure clearly shows how the yoke 8, with attached mirror 10, rotates on the torsion hinge 6 until the yoke landing tips 9 come in contact (lands) with the underlying landing pad sites 3. It is this mechanical contact between the yoke landing tips 9 and the landing pad sites 3 that is of particular relevance to this invention. A problem with conventional DMD's is that of "sticking mirrors", where the landing tips are slow in lifting off the pad, effecting the response of the device, or in some cases become permanently stuck to the landing pads. There appear to be several sources of this sticking problem, some of which include moisture in the package, landing tips scrubbing into the metal landing pads, and outgassing of the epoxy sealants used in the manufacturing process for mounting the devices in their packages and mounting the optical glass cover on the packages. This "sticking" problem has been addressed by applying a lubrication or passivation layer to the metal surfaces to make them "slick" and also through the use of resonant reset methods to pump energy into the pixel to help break it free from the constraining surface contact. More recently, "spring-tips" have been added to the tips of the mirrors to help overcome this sticking problem. In addition, gettering material is often added to absorb moisture within the package. Although quite effective, these solutions still have the concern of long-term degradation of the passivant, which could drive the technology to a requirement for hermetic packages and complex process steps prior to window attachment. This would add additional expense, complexity, and difficulty in delivering the product.

It is therefore desirable to implement a DMD that will rotate reliably and predictably to a given angle, consistent across the length of the device or an array of pixels, without physically contacting the memory substrate surface below and as a result to avoid all the difficulties of breaking that contact. Eliminating the stiction problem would allow more predictable performance of the mirror array, and eliminate the most frequent cause of device failure; i.e., stuck bright mirrors. The lack of contact would also provide more immunity to particulates on the first electrode level, allow special dark metal light absorbing layers, and enable the use of conventional CMOS electrical passivation layers like $SiO_2$. The invention disclosed herein addresses this need.

Representative prior conventional structures of the general type are shown in U.S. Pat. No. 5,535,047 to Hornbeck, and in publications (1) "Digital Light Processing™ for High-Brightness, High-Resolution Applications," by Larry J. Hornbeck, Electronic Imaging, EI'97, Projection Displays III, Co-Sponsored by IS&T and SPIE, Feb. 10–12 1997, san Jose, Calif., and (2) "Digital Light Processing and MEMS: Timely Convergence for a Bright Future," Larry J. Hornbeck, Micromachining and Microfabrication '95, Part of SPIE's Thematic Applied Science and Engineering Series, Oct. 23–24 1995, Austin, Tex.

SUMMARY OF THE INVENTION

A new DMD device and method for non-contacting edge-coupled hidden hinge geometry is disclosed. This approach requires no physical contact between the mirror or underlying yoke and landing pads at the surface of the CMOS substrate. As a result, this eliminates the problem of "sticking" mirrors in conventional devices and significantly reduces the requirements for delicate passivation coatings and costly hermetic packages.

This method uses a more or less conventional DMD structure which still maintains digital operation, but one which has been modified to operate about either an orthogonal or diagonal axis, to deflect the pixel into the vicinity of the desired rotation position and then capture it with an edge coupled capacitive electrostatic force which latches the DMD mirror at the desired angle of rotation.

As with conventional DMD's, the rotation angle is simply determined by the thickness of the organic layers used to build up the DMD superstructure. During fabrication of the device, a capture (positioning) electrode will be provided at an appropriate elevation above the surface of the device so as to be in close proximity with the continuous edge of the rotating mirror or yoke when it rotates into the region of the desired angle. This stop electrode is pulsed such as to establish a very high electrostatic attraction with the mirror assembly as it comes into the plane of the capture electrode. By tailoring the capture electrode pulse waveform, the mirror can be critically damped to provide stable operation and to prevent oscillations of the DMD mirrors about the desired angle of rotation.

This approach:
  eliminates sticking due to contacting or landed DMD pixel architectures,
  eliminates the need for passifying landing surface during manufacturing steps,
  eliminates long term degradation due to landing surface contact and/or passivation degradation,
  eliminates moisture sensitivity and therefore the need for hermetic packages, and
  provides a fixed rotation angle through electrostatic capture, rather than a physical mechanical stop to determine rotational angle,
  provides uniform release characteristic of mirrors upon release and return to flat state, and
  enables a "fast clear" function where all mirrors can be sent to flat state by a single voltage change.

DESCRIPTION OF THE VIEWS OF THE DRAWINGS

The included drawings are as follows:

FIG. 9b shows a magnification of the intense field concentration area of FIG. 8a.

DETAILED DESCRIPTION

The present invention uses the highly attractive forces of an intense electrostatic field region, applied to the edge of a DMD mirror or yoke, to stop the rotation of the mirror assembly without any physical contact with the underlying device substrate, and as a result eliminates "sticking" mirrors and the problems, discussed in the related art, associated with breaking the contact of stuck mirrors. This approach maintains digital operation, allowing the mirror to rotate reliably and predictably to a given angle, consistent across the array of pixels, while avoiding contact with the substrate floor.

Figure 5:
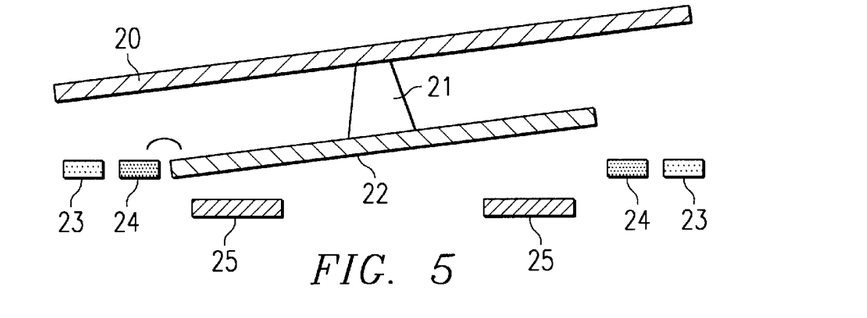
FIG. 5 is a diagram of the new edge-coupled DMD mirror structure of this invention.

FIG. 5 shows a diagram for the new edge-coupled DMD mirror structure of this invention. Much like conventional hidden-hinge DMD's, the device is comprised of a mirror 20 attached to a yoke 22 by means of a mirror support post 21, mirror address electrodes 23, and yoke address electrodes 25. However, new capture electrodes 24 have been added at the fabrication level of the mirror address electrodes 23. In operation, the mirror rotates due to the attractive forces caused by the electrostatic fields between the mirror 20 and mirror address electrode 23 and between the yoke 22 and the yoke address electrode 25, until it is stopped at the desired angle by the highly attractive electrostatic forces between the edge of the yoke 22 and the added capture electrode 24. This is different from conventional hidden-hinge DMD's where the mirror assembly continues to rotate until the yoke 22 contacts solid landing pads located at the device's lower substrate level. The rotation angle is simply determined, as in the case of conventional DMD's, by the thickness of one of the organic spacer layers used to build-up the DMD structure. In this preferred embodiment, the capture electrode 24 is shown adjacent to the yoke 22, although in an alternate configuration the capture electrode 24 could sit adjacent to the mirror 20.

Figure 6:
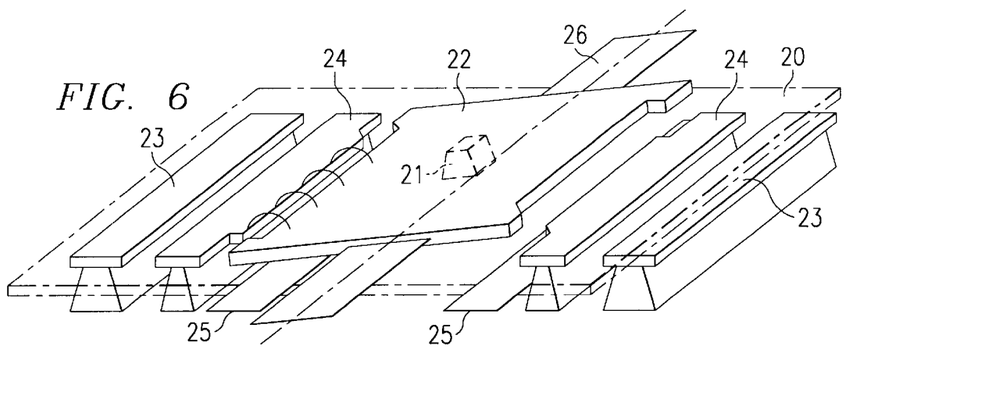
FIG. 6 is a perspective view of the new edge-coupled DMD mirror structure of this invention.

FIG. 6 is a perspective view of the new edge-coupled DMD structure of this invention with the mirror 20 shown transparent (dotted line) for clarity purposes. Also shown in this view are the torsion hinges 26. This illustrates the high attractive forces at the low end (left side) of the rotated mirror, where the yoke 22 and capture electrode 24 are in close proximity, as compared to the much lower attractive forces at the high end (right side) of the rotated mirror. This attractive force is a function of the capacitance and distance between the edges of the yoke and capture electrode. This depends highly on the area of the edge surfaces of the yoke and capture electrode and the distance between them, the distance being related quadratically as $f=1/d^2$. In this configuration, the mirror rotates along an orthogonal axis that places the entire edge of the mirror or yoke adjacent and in close proximity to the capture electrode 24.

Figure 7A:
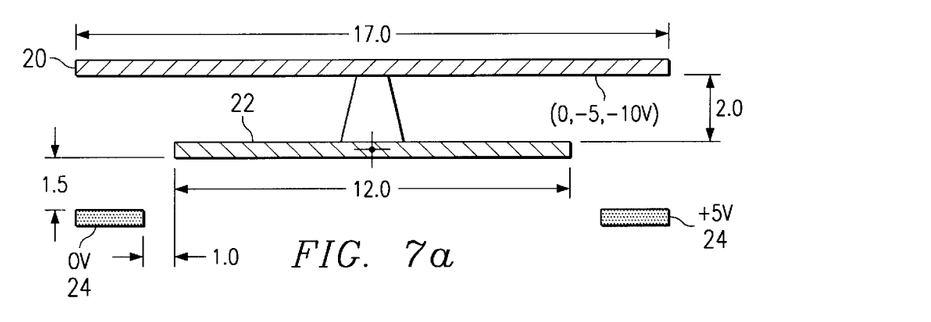
FIG. 7a shows typical dimensions for the new edge-coupled DMD mirror structure as used in the model.
Figure 7B:
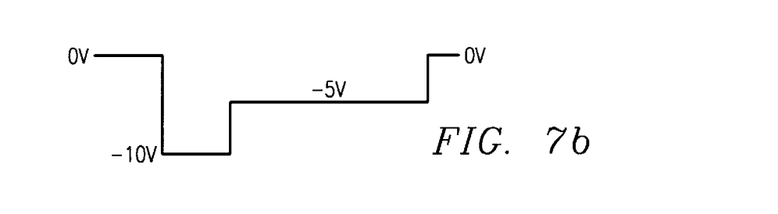
FIG. 7b illustrates the rotational operation of the new edge-coupled DMD mirror.

FIG. 7a shows typical dimensions for the new edge-coupled DMD mirror structure. The nominal dimensions will accommodate the new edge-coupled technique nicely and are typical of those in used in the fabrication of conventional DMD's. Also, shown are typical voltages required to provide the stopping action of the rotating mirror structure. In this case, the capture electrode 24 on the side of the device where it is desired that the mirror stop is biased at +5 volts, while the capture electrode on the opposite side of the device is held at 0 volts. Then a pulsed waveform whose amplitude steps from 0 volts to −10 and then to −5 volts is applied to the mirror assembly, as shown in FIG. 7b. In operation, the higher −10 volts is required to arrest or stop the downward rotation, while the lower −5 volts is used to hold the mirror assembly in a stable state at the desired rotation angle. These represent only typical voltage ranges, based on modeling data, within which optimal pulsed waveforms can be determined.

Figure 7C:
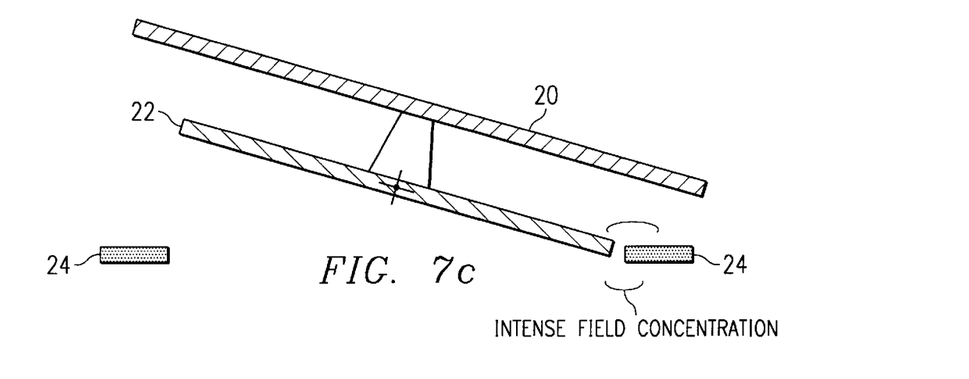
FIG. 7c illustrates the rotation action of the mirror assembly relative to the capture electrodes.

FIG. 7c illustrates the rotation action of the mirror assembly relative to the capture electrodes 24. The axis of rotation is at the centroid of the yoke 22. The mirror assembly rotates to the desired angle, in either the positive or negative direction depending on the bias conditions of the mirror and yoke address electrodes (not shown). A physical gap of <2µ exists between the yoke 22 and the capture electrode 24 at their closest alignment and the model shows that this spacing along with the appropriate biasing of the capture and address electrodes will provide the necessary stopping action. In operation, as the edges of the yoke 22 and capture electrode 24 come into close proximity of each other, the forces of attraction between the two dominates over the hinge force and rotation is stopped and then clamped at the desired angle by an electrostatic clamping action caused by the intense field concentration along the sharp edges.

Figure 8A:
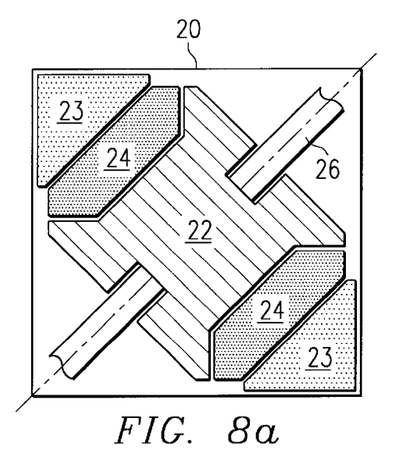
FIGS. 8a and 8b show diagonal and orthogonal configurations of the non-contacting edge-coupled structures.
Figure 8B:
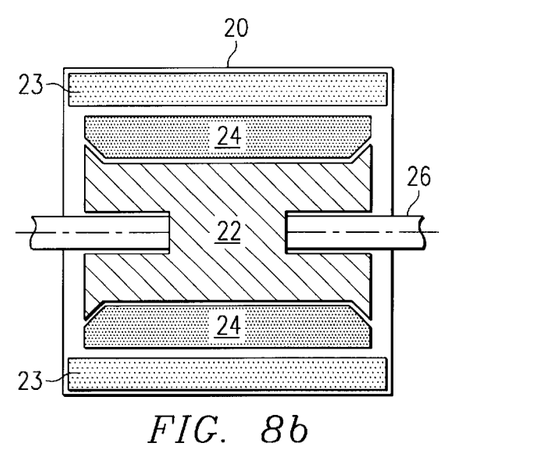

FIGS. 8a and 8b show diagonal and orthogonal configurations, respectively, for the pixel structure at the yoke/capture electrode plane. Both figures show the respective layouts comprising the yoke 22, two mirror address electrodes 23 (one on each side of the rotation axis), two capture electrodes 24 (one on each side of the rotation axis), and the torsion hinges 26. The mirror 20 is shown (dotted line) to illustrate the diagonal and orthogonal mirror placement, respectively. Not shown are the two yoke address electrodes 25, which are located on the lower substrate plane as shown in FIG. 5. It is important that the entire length along the edge of the yoke 22 and the capture electrode 24 come in close proximity of each other during rotation of the mirror assembly to provide the maximum stopping force. As a result, this non-contact, edge-coupled technique is constrained for only use at the yoke level for the diagonal configuration of FIG. 8a, but could be used at both the yoke and/or mirror level for the orthogonal configuration of FIG. 8b. This is true since in the diagonal configuration, the edge of the mirror is tilted relative to the plane of the capture electrode. Most DMD's are of the hidden hinge variety where all the underlying structure is covered by the mirrors to provide as much mirror fill factor as possible, with only very small gaps between the mirrors and therefore would utilize yoke alignment. The diagonal configuration of FIG. 8a, can take advantage of existing dark-field projection optics, used with conventional DMD's. On the other hand, the orthogonal configuration of FIG. 8b, will require some modification to the optics, but does offer the advantage that the relative area or volume of interaction of the yoke 22 and capture electrode 24 are significantly increased, as illustrated in the figures, which results in improved torque and stopping ability.

Figure 9A:
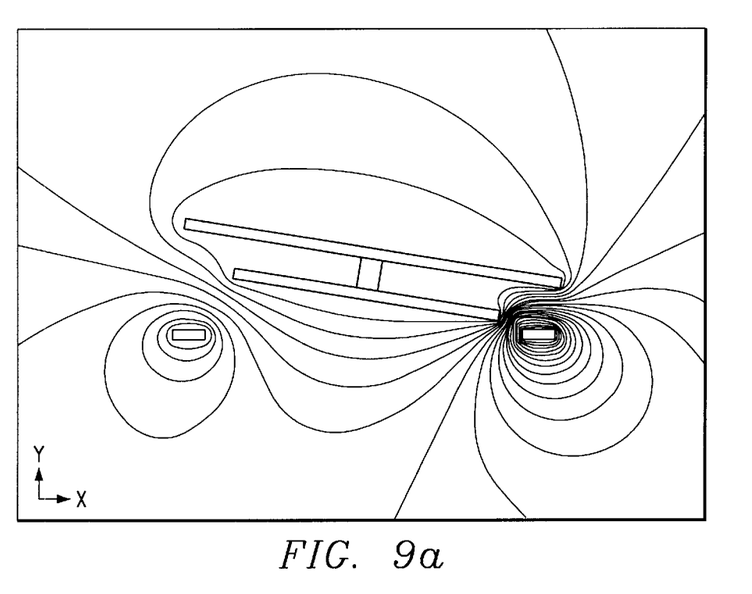
FIG. 9a shows modeling data for the new edge-coupled DMD illustrating the high attractive forces at the intense field concentration area of the rotated mirror.

FIG. 9a shows modeling data for the new edge-coupled DMD, illustrating the high attractive forces at the intense field concentration area of the rotated mirror as contrasted with the weaker attractive forces around the area of the capture electrode on the other side of the mirror. This modeling data illustrates the static condition that exists when the yoke 22 and capture electrode 24 come in close proximity with one another. The results of this modeling indicates that when the mirror/yoke voltage is turned off (0 volts) that the mirror will start rotating, due to the mirror and yoke address electrodes 23 and 25, respectively. This represents a large improvement over conventional DMD's that requires a high-energy resonant pulse to kick the mirror/yoke loose from the landing pad. As the mirror deflects into the vicinity of the desired rotation position, it begins to slow down as the edge coupled capacitive electrostatic potential builds up and the force component moves from vertical (rotational torque) to tangential (latching torque), indicated by the intense field lines in the modeling data, until at some point these forces relative to the mirror rotational forces are such that the mirror will be latched at the desired angle.

Figure 9B:
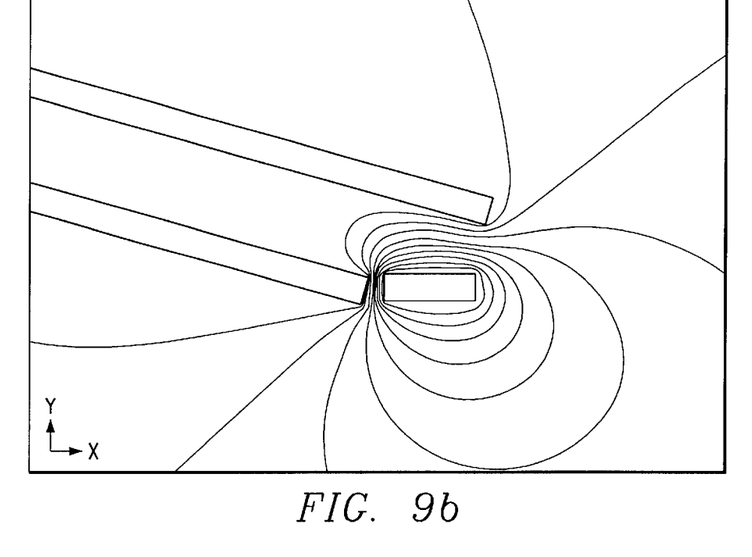

FIG. 9b shows a magnified view of the high intensity region around the capture electrode and yoke. Although this indicates that the mirror assembly will finally come to rest at the desired angle in a static sense, there are dynamics involved that requires proper damping of the action.

Figure 10:
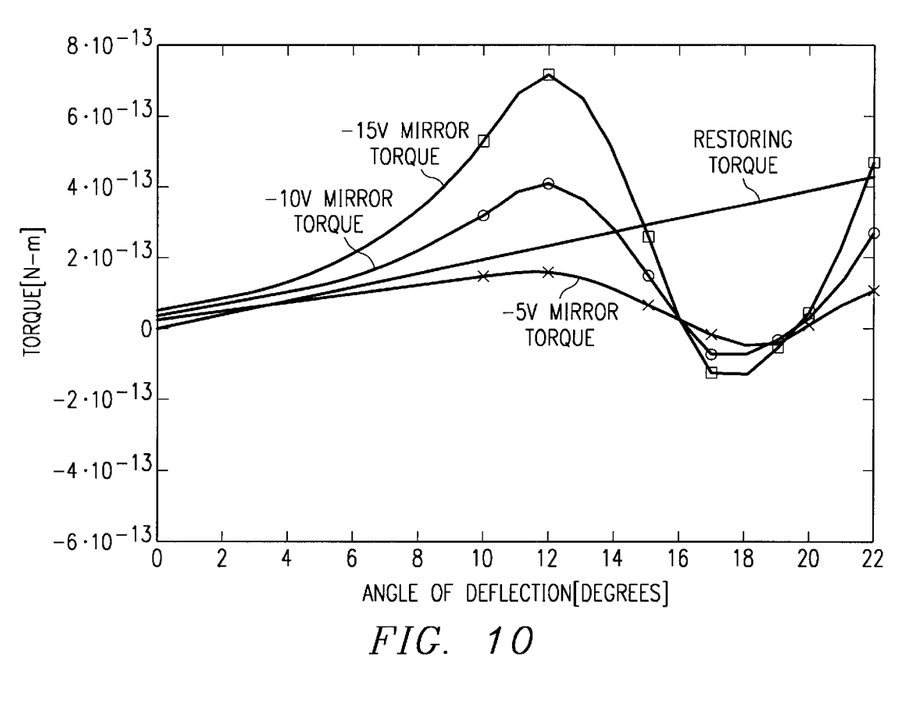
FIG. 10 is modeling data showing restoring torque vs. mirror torque for the new edge-coupled DMD.

FIG. 10 is a plot of the restoring torque vs. mirror torque based on the modeling data. This illustrates that for a desired angle, 12° for this model, the torque on the mirror can be made to quickly reverse. As a result, by applying the proper bias to the capture electrode and by tailoring the mirror pulse waveform the mirror rotation can be made to stop at the desired tilt angle and can further be operated in a critically damped state to cause minimal oscillations in the mirror as it comes to rest at the desired angle.

Figure 11A:
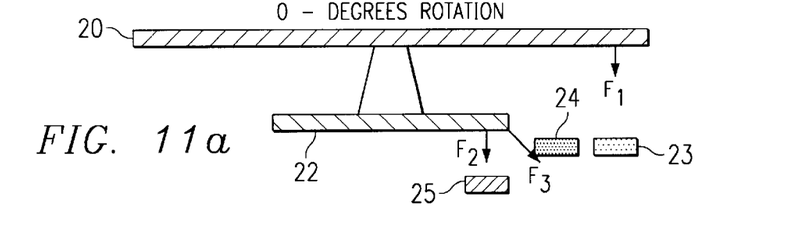
FIGS. 11a–11d are diagrams illustrating the vector forces affecting the rotation and capture of the mirror assembly.

FIG. 11 is a diagram that illustrates the action of the mirror assembly's rotation and how it is stopped adjacent to the capture electrode. The various vector forces that cause the rotation and capture of the mirror assembly are shown. FIG. 11a shows the mirror assembly at 0° rotation, along with the various electrostatic forces as follows:

$F_1$ between the mirror 20 and mirror address electrode 23, $F_2$ between the yoke 22 and yoke address electrode 25, and $F_3$ between the 22 yoke and the capture electrode 24.

Figure 11B:
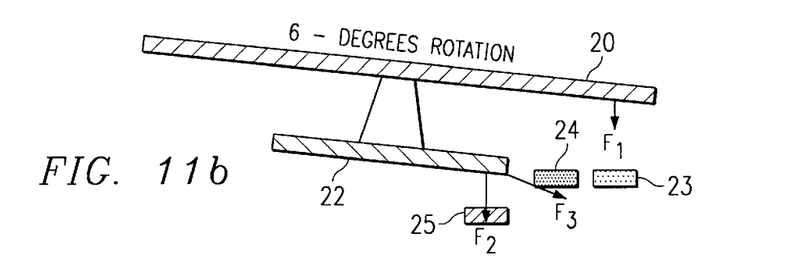

FIG. 11b shows the conditions when the voltage waveforms applied to the various electrodes are such to cause the mirror assembly to start to rotate; as an example at 6° rotation. Here, forces $F_1$, $F_2$, and $F_3$ are all greater, such as to set up the dynamic state of the mirror assembly.

Figure 11C:
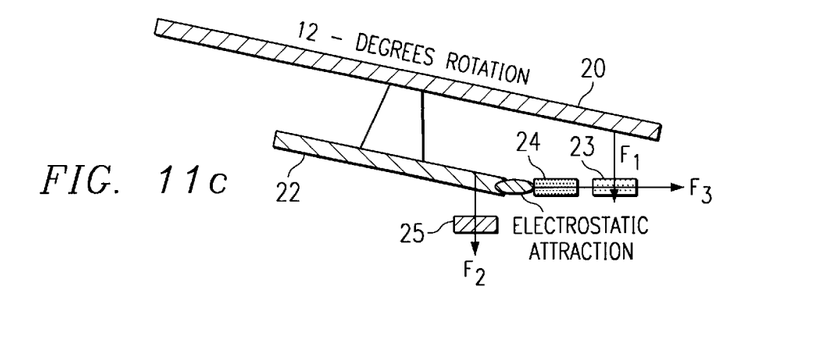

FIG. 11c shows the mirror assembly rotated to the desired angle, 12° in this example. In this case the very strong tangential electrostatic force $F_3$ between the yoke 22 and the capture electrode 24 are such as to capture and hold the mirror assembly in a state where all the various forces are in equilibrium. The goal is to reach this state in a critically damped fashion so that there is no over rotation, although in practice some slight amount of overshoot may be expected.

Figure 11D:
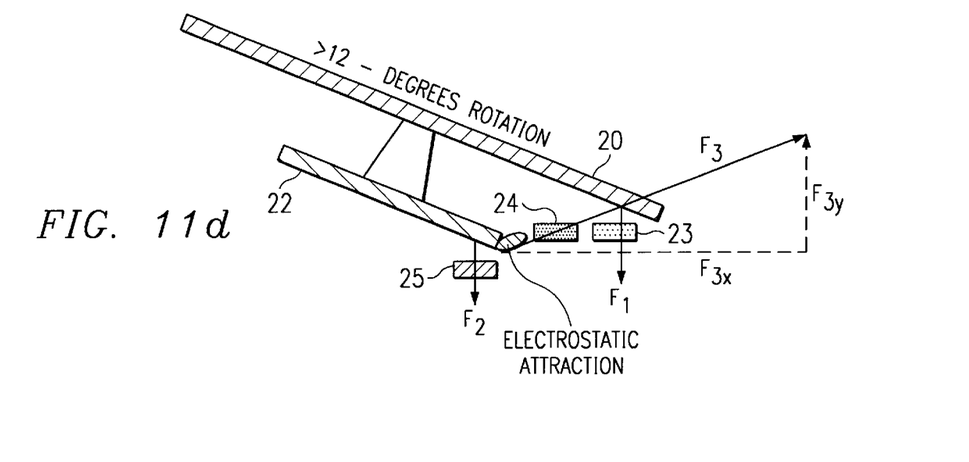

FIG. 11d shows the case where the mirror assembly is slightly under damped and overshoots the desired angle of rotation. In this case the force $F_3$ between the yoke 22 and capture electrode 24 is rotated negatively so as to produce a horizontal vector $F_{3x}$ and a vertical vector $F_{3y}$, as shown. As discussed earlier in FIG. 10, these reverse forces quickly cause the mirror assembly to turn around and go in the opposite direction where the yoke 22 is captured by the capture electrode 24, when the following conditions are met:

$$F_1+F_2=F_{3y}.$$

Finally, it should be pointed out that in the case of a catastrophic event where the mirror rotational forces are such that the mirror cannot be stopped, due to improperly timed or scaled driving voltages, the mirror will continue to rotate until it lands in a conventional and non-destructive manner.

DMD projection displays will benefit considerable from the improvements in the non-contacting, edge-coupled, hidden-hinge DMD architecture of this invention; namely in the areas of higher performance, improved reliability, and lower cost. This is primarily due to the longer life of the DMD's and the lower cost of the packaging of the devices.

Figure 12A:
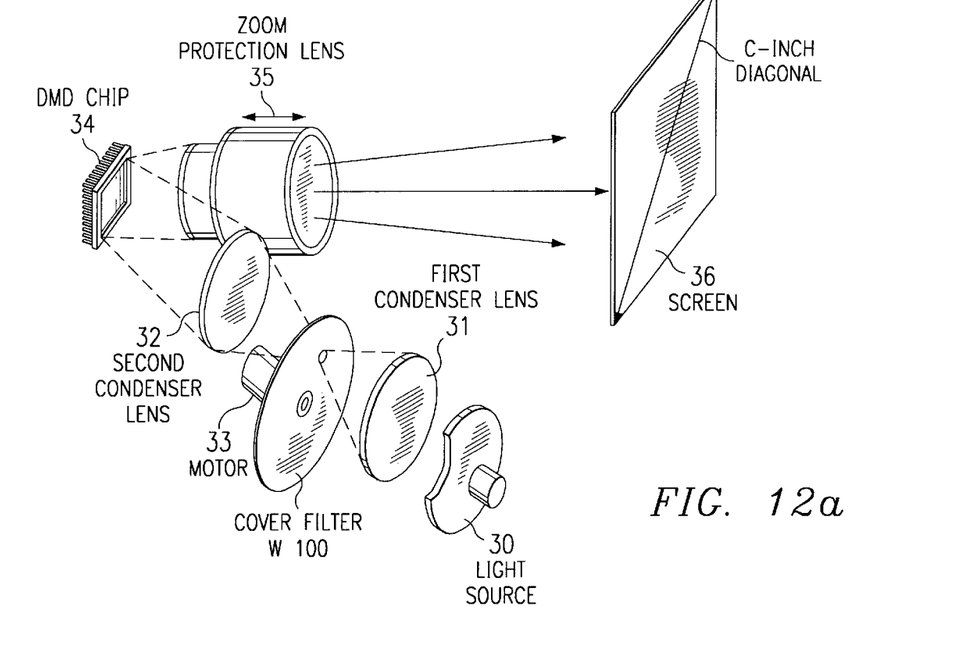
FIG. 12a is a schematic of a digital projection display that uses the non-contacting, edge-coupled DMD of this invention.

Two embodiments of projectors that will benefit from the use of non-contacting, edge-coupled, hidden-hinge DMD architecture of this invention are shown in FIG. 12. FIG. 12a is a block diagram of a single DMD embodiment, comprised of a light source 30, first and second condenser optics 31 and 32, a rotating color wheel and motor 33, the DMD 34 of this invention, a projection lens 35, and a projection screen 36. This configuration operates the DMD in the color field sequential mode, whereby red-green-blue light is sequentially generated from a white light source 31, by means of the color filter segmented rotating wheel 33 and applied to array of mirrors on the surface of the DMD 34. This configuration operates the DMD 34 at high speeds, 5.6 mSec per color field, in order to sequentially read in the three (red, green, and blue) fields in a single TV field time of 16.7 mSec. Projectors of this type are typically used in medium brightness applications, such as in conference rooms and home theaters.

Figure 12B:
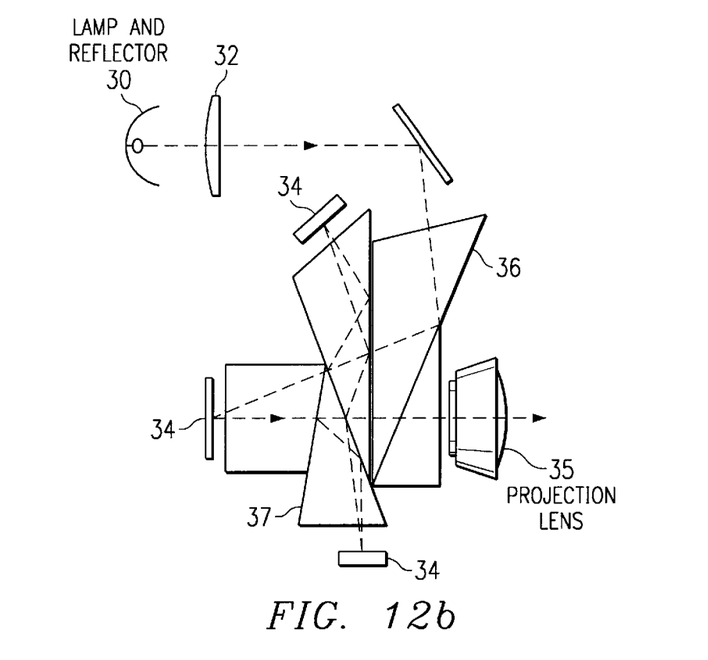
FIG. 12b is a schematic of a high brightness digital projection display that uses the non-contacting, edge-coupled DMD of this invention.

FIG. 12b shows a second embodiment of a 3-DMD projector utilizing the non-contacting, edge-coupled, hidden-hinge DMD architecture of this invention. This implementation uses three of the DMD's 34, one each dedicated for the red, green, and blue primary colors. In this case the field time is 16.7 mSec, which requires the DMD to hold the charge in the cell for quite a long time. The projector for this embodiment is comprised of a white light source/reflector 30, a condenser lens 32, a total internal reflective (TIR) prism 36, a color splitting/combining prism 37, three DMD's 34 of this invention, a projection lens 35, and a projection screen (not shown). Projectors of this type are typically used in higher brightness applications, such as in large convention centers and cinema theaters.

The benefits of this approach over conventional hidden hinge DMD structures includes the following:
1. Allows both manufacture and addressing of the DMD using primarily a conventional hidden hinge architecture, but avoids having to land the mirror or yoke in order to define the angle of rotation,
2. provides a method and an architecture for limiting the motion of the DMD about a rotation angle through the introduction of a capacitively coupled edge connected potential well method for centering the pixel at the desired rotation angle,
3. inherently provides a method for damping the rotational oscillations for the DMD mirror that might occur by not contacting a hard landing surface,
4. eliminates the need for passivation of the DMD surfaces,
5. eliminates the need for a resonant reset pulse to free a "stuck" mirror,
6. is quite insensitive to moisture content which eliminates the need for hermetic packages for the DMD, thereby simplifying the overall manufacturing process,
7. still offers a non-destructive landing method in the case of over stress to the device from electrostatic or improperly times, or scaled driving voltages,
8. avoids any distortion to the mirror due to the torquing between the landed tip and fulcrum of the mirror, as can occur in conventional DMD's, and
9. provides a latching mechanism to permit asynchronous addressing.

These benefits result in the following major advantages of the non-contacting, edge-coupled hidden hinge DMD:
1. Eliminates sticking due to contacting or landing DMD pixel architectures,
2. eliminates the need for passivation of landing surfaces during manufacturing process,
3. eliminates long term degradation due to landing surface contact and/or passivation degradation,
4. eliminates moisture sensitivity and therefore any need for a hermetic package, and
5. provides a fixed rotation angle through electrostatic, rather than mechanical means,
6. provides more uniform response on release of mirrors,
7. provides faster clear function by turning the device bias ON/OFF, and
8. the underlying structure can be made from dark metal that is passivated to reduce the light scattering effects from the DMD sub-structure that tends to destroy the contrast.

While the invention has been described in the context of two preferred embodiments; i.e., i) the edge latching of the yoke, and ii) the latching of the mirror, it will be apparent to those skilled in the art that the present invention may be modified in numerous ways and may assume other embodiments other that that specifically set out and described above. Accordingly, it is intended by the appended claims to cover all modifications of the invention which falls within the true spirit and scope of the invention.

I claim:

1. A method of operating a micromechanical device comprising:
   providing a micromechanical device comprising a deflectable member and at least one non-contacting capture electrode supported by a substrate;
   electrostatically deflecting said deflectable member; and
   stopping said deflection of said deflectable member using electrostatic attraction between said non-contacting capture electrode and said deflectable member.

2. The method of claim 1, said providing a deflectable member comprising:
   providing a deflectable member having an underlying yoke, whereby said deflectable member and underlying yoke are stopped without physical contact with the surface of the substrate or said capture electrode.

3. The method of claim 2, said stopping comprising:

stopping said deflection when an edge of said non-contacting capture electrode aligns in with an edge of said yoke and said electrostatic attraction hold said deflectable member at a deflection angle.

4. The method of claim 1, said providing a deflectable member comprising:

providing a deflectable member such that said deflectable member rotates about a hinge axis without contact, preventing sticking of said deflectable member and allowing freedom of rotation.

5. The method of claim 1, said electrostatically deflecting step comprising:

electrostatically deflecting said deflectable member to a tilt angle determined by the geometrical placement of said non-contacting capture electrode relative to said deflectable member.

6. The method of claim 1, said providing step comprising:

providing a predominately rectangular deflectable mirror member supported by a torsion hinge, said deflectable mirror member orthogonally aligned relative to said torsion hinge.

7. The method of claim 1, said providing step comprising:

providing a predominately rectangular deflectable mirror member supported by a torsion hinge, said deflectable mirror member diagonally aligned relative to said torsion hinge.

8. The method of claim 1, said providing said non-contacting capture electrode comprises locating said non-contacting capture electrode at a vertical level above said substrate to determine a tilt angle at which the deflection of said deflectable member is stopped.

9. The method of claim 1, said stopping comprising:

stopping said deflection when the edge of said non-contacting capture electrode aligns in with the edge of said deflectable member and said electrostatic attraction holds said deflectable member at a deflection angle.

10. The method of claim 1, said stopping comprising:

applying a bias between said deflectable member and said non-contacting capture electrode to produce electrostatic forces operable to stop said deflection.

11. The method of claim 1, said stopping comprising:

applying a bias between said deflectable member and said non-contacting capture electrode to damp the deflection of said deflectable member.

12. A micromechanical device comprising:

a substrate;

a deflectable member supported by said substrate; and a non-contacting capture electrode positioned to stop deflection of said deflectable member by electrostatic attraction between said deflectable member and said non-contacting capture electrode.

13. The micromechanical device of claim 12, said deflectable member comprising a yoke, whereby neither said deflectable member nor said yoke make physical contact with said substrate or said non-contacting capture electrode.

14. The of claim 13 whereby an edge of said yoke aligns with an edge of said non-contacting capture electrode to stop the rotation of said deflectable member at the desired angle.

15. The of claim 13 whereby an edge of said mirror aligns with an edge of said non-contacting capture electrode to stop the rotation of said deflectable member at the desired angle.

16. The micromechanical device of claim 12 comprising:

said deflectable member comprising a yoke, a mirror, and a mirror support post connecting said yoke and said mirror;

at least two mirror address electrodes;

at least two yoke address electrodes;

at least two non-contacting capture electrodes; and a substrate comprising a binary memory cell.

17. The micromechanical device of claim 16, wherein said deflectable member avoids contact with said mirror address electrodes, said yoke address electrodes, said non-contacting capture electrodes, and said substrate.

18. The micromechanical device of claim 12 wherein:

said non-contacting capture electrode is biased at a DC level;

said deflectable member is biased with a pulsed waveform;

said deflectable member rotates in a direction dependent on a state of said binary memory cell;

the rotation of said deflectable member stops when it aligns in close proximity with said non-contacting capture electrode;

said deflectable member remains in said alignment until biasing conditions are changed.

19. The micromechanical device of claim 18 wherein said capture electrode bias and said deflectable member bias are sufficient to hold said deflectable member in alignment as the state of said binary memory cell changes.

20. The micromechanical device of claim 18 whereby rotational oscillations of said deflectable member are damped by said bias pulsed waveform.

21. The micromechanical device of claim 18 said deflectable member operable to return to an undeflected state upon removal of said DC bias level and said pulsed bias waveform.

22. The micromechanical device of claim 12, further comprising:

a non-hermetic package enclosing said micromechanical device.

23. The micromechanical device of claim 12, further comprising:

a package enclosing said micromechanical device without the use of getters.

24. The micromechanical device of claim 12, further comprising:

a package enclosing said micromechanical device without the use of passivation materials.

25. A display comprising:

a light source for producing a beam of light along a first light path;

a non-contacting, edge-coupled micromirror device on said first light path for modulating said beam of light and reflecting said modulated beam of light along a second light path; and a projection lens on said second light path for focusing said reflected modulated beam of light onto an image plane.

26. The display of claim 25 further comprising:

a rotating color wheel and motor on said first light path.

27. The display of claim 25, said non-contacting, edge-coupled micromirror device comprising three non-contacting, edge-coupled micromirror devices comprising:

a color splitting/combining prism on said first and said second light paths for separating said beam of light into three single color beams of light and directing said three single color beams of light to three said micromirror devices and combining three said reflected modulated beams of light.

* * * * *